US009818598B2

(12) United States Patent
Aibara et al.

(10) Patent No.: US 9,818,598 B2
(45) Date of Patent: Nov. 14, 2017

(54) SUBSTRATE CLEANING METHOD AND RECORDING MEDIUM

(71) Applicants: TOKYO ELECTRON LIMITED, Tokyo (JP); JSR CORPORATION, Tokyo (JP)

(72) Inventors: Meitoku Aibara, Koshi (JP); Yuki Yoshida, Koshi (JP); Hisashi Kawano, Koshi (JP); Masami Yamashita, Koshi (JP); Itaru Kanno, Tokyo (JP); Kenji Mochida, Tokyo (JP); Motoyuki Shima, Tokyo (JP)

(73) Assignees: Tokyo Electron Limited, Minato-Ku (JP); JSR Corporation, Minato-Ku (JP)

( * ) Notice: Subject to any disclaimer, the term of this patent is extended or adjusted under 35 U.S.C. 154(b) by 0 days.

(21) Appl. No.: 14/809,373

(22) Filed: Jul. 27, 2015

(65) Prior Publication Data

US 2016/0035564 A1 Feb. 4, 2016

(30) Foreign Application Priority Data

Jul. 31, 2014 (JP) ................................ 2014-157194

(51) Int. Cl.

| | |
|---|---|
| ***B08B 7/00*** | (2006.01) |
| ***H01L 21/02*** | (2006.01) |
| ***H01L 21/67*** | (2006.01) |
| *B08B 3/08* | (2006.01) |

(52) U.S. Cl.

CPC .... *H01L 21/02057* (2013.01); *H01L 21/6715* (2013.01); *H01L 21/67028* (2013.01); *H01L 21/67051* (2013.01); *B08B 3/08* (2013.01); *H01L 21/02041* (2013.01)

(58) Field of Classification Search

CPC .................. H01L 21/02041; H01L 21/02057; B08B 3/08

See application file for complete search history.

(56) References Cited

U.S. PATENT DOCUMENTS 6,776,851 B1 * 8/2004 Singh ................. C23C 16/4404 118/715
2003/0040192 A1 * 2/2003 Kanegae .......... H01L 21/31138 438/710
2014/0144465 A1 5/2014 Kaneko et al.
2016/0035561 A1 * 2/2016 Aibara ..................... B08B 3/08 134/4
2016/0035564 A1 * 2/2016 Aibara ..................... B08B 3/08 134/4

FOREIGN PATENT DOCUMENTS

JP 2014-123704 A1 7/2014

* cited by examiner

*Primary Examiner* — Bibi Carrillo
(74) *Attorney, Agent, or Firm* — Burr & Brown, PLLC

(57) ABSTRACT

An object of the present invention is to be able to obtain a high removing performance of particles. The substrate processing method according to the exemplary embodiment comprises a film-forming treatment solution supply step and a removing solution supply step. The film-forming treatment solution supply step comprising supplying to a substrate, a film-forming treatment solution containing an organic solvent and a fluorine-containing polymer that is soluble in the organic solvent is supplied. The removing solution supply step comprises supplying to a treatment film formed by solidification or curing of the film-forming treatment solution on the substrate, a removing solution capable of removing the treatment film.

10 Claims, 6 Drawing Sheets

| | | Substrate | |
|---|---|---|---|
| | | Bare silicon wafer | SiN wafer |
| Chemicals | Top coat solution | Good | Poor |
| | Film-forming treatment solution | Good | Good |

SUBSTRATE CLEANING METHOD AND RECORDING MEDIUM

CROSS-REFERENCE TO RELATED APPLICATIONS

This application is based upon and claims the benefit of priority from Japanese Patent Application No. 2014-157194 filed on Jul. 31, 2014; the entire contents of which are incorporated herein by reference.

BACKGROUND OF THE INVENTION

Field of the Invention

Exemplary embodiments of the present disclosure relate to a substrate cleaning method and a recording medium.

Background Art

From the past, a substrate cleaning device has been known with which particles attached to a substrate such as a silicon wafer and a compound semiconductor wafer are removed. For example, in Japanese Patent Laid-Open Publication No. 2014-123704, a substrate cleaning method is disclosed wherein a treatment film is formed on surface of a substrate by using a topcoat solution, and then by removing this treatment film, particles on the substrate are removed together with the treatment film.

SUMMARY OF THE INVENTION

However, by the method described in Japanese Patent Laid-Open Publication No. 2014-123704, for example, when a substrate having a underlayer film is processed, the treatment film cannot be fully removed depending on the substrate to be treated, so that there have been a possibility that a high removing performance of the particles cannot be obtained.

An exemplary embodiment has an object to provide a substrate cleaning method and a recording medium, with which a high removing performance of the particles can be obtained.

A substrate cleaning method according to the exemplary embodiment comprises a film-forming treatment solution supply step and a removing solution supply step. The film-forming treatment solution supply step comprises supplying to a substrate, a film-forming treatment solution containing an organic solvent and a fluorine-containing polymer that is soluble in the organic solvent. The removing solution supply step comprises supplying to a treatment film formed by solidification or curing of the film-forming treatment solution on the substrate, a removing solution capable of removing the treatment film.

According to the exemplary embodiment, a high removing performance of the particles can be obtained.

DETAILED DESCRIPTION OF THE INVENTION

Hereunder, by referring to the attached drawings, exemplary embodiments of the substrate cleaning method and the recoding medium disclosed by the present application will be explained in detail. Meanwhile, the present invention is not restricted by the exemplary embodiments shown below.

[Substrate Cleaning Method]

First of all, contents of the substrate cleaning method according to the exemplary embodiment of the present disclosure will be explained by using FIG. 1A to FIG. 1E. FIG. 1A to FIG. 1E are explanatory drawings of the substrate cleaning method according to the exemplary embodiment of the present disclosure.

Figure 1A:
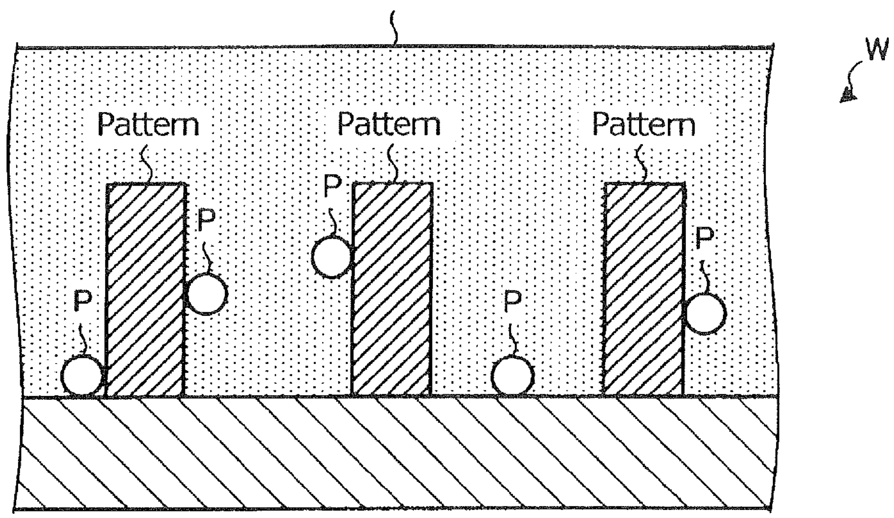
FIG. 1A is an explanatory drawing of the substrate cleaning method according to the exemplary embodiment of the present disclosure.

As shown in FIG. 1A, in the substrate cleaning method according to the exemplary embodiment of the present disclosure, a "film-forming treatment solution" is supplied to a pattern-formed surface of a substrate such as a silicon wafer and a compound semiconductor wafer (hereinafter, also referred to as "wafer W").

The "film-forming treatment solution" of the exemplary embodiment of the present disclosure is a composition for substrate cleaning which comprises an organic solvent and a fluorine-containing polymer that is soluble in the organic solvent (preferably, a polymer having a partial structure represented by the formula (1) discussed later). By using the film-forming treatment solution, a high removing performance of particles can be obtained regardless of the kind of the underlayer film. Meanwhile, the polymer is not limited to the one having the partial structure represented by the formula (1) discussed later, whereby if it contains a fluorine atom, the same effect as mentioned above can be obtained.

The film-forming treatment solution supplied to the pattern-formed surface of the wafer W becomes a treatment film by solidification or curing of the film-forming treatment solution. This results in a state in which the pattern formed on the wafer W and the particles P attached to the pattern are covered with the treatment film (see FIG. 1B). Meanwhile, the term "solidification" used herein means a solution becomes a solid; and the term "curing" means that molecules are connected with one another to become a polymer (for example, crosslinking and polymerization).

Figure 1B:
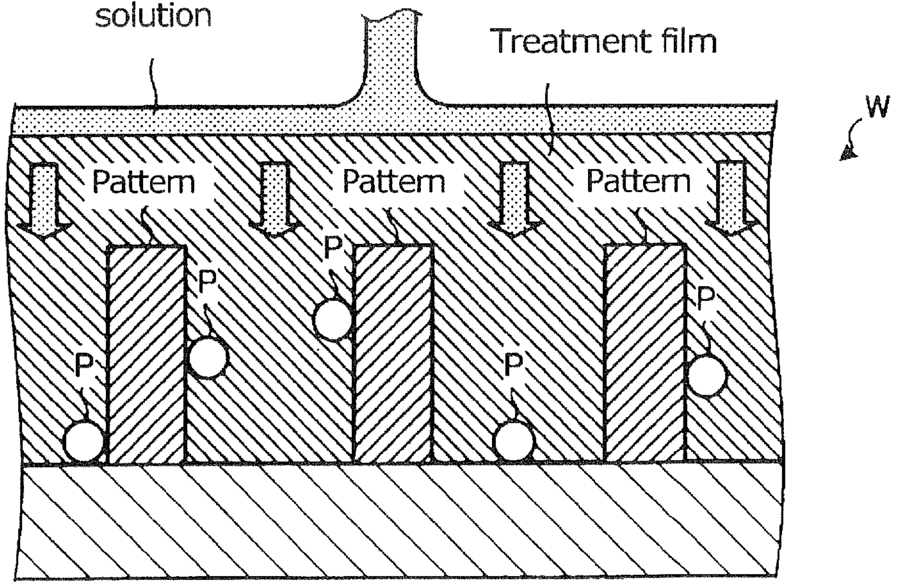
FIG. 1B is an explanatory drawing of the substrate cleaning method according to the exemplary embodiment of the present disclosure.
Figure 1C:
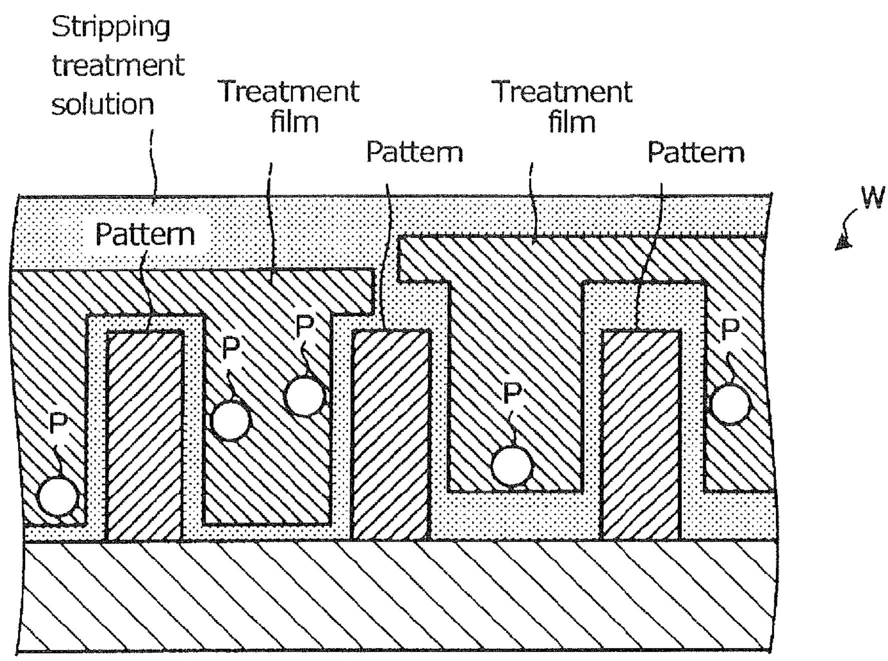
FIG. 1C is an explanatory drawing of the substrate cleaning method according to the exemplary embodiment of the present disclosure.

Next, as shown in FIG. 1B, a stripping treatment solution is supplied to the treatment film formed on the wafer W. The stripping treatment solution is a treatment solution for stripping the treatment film from the wafer W.

After being supplied to the treatment film, the stripping treatment solution penetrates into the treatment film to reach an interface between the treatment film and the wafer W. Because the stripping treatment solution penetrates to the interface between the treatment film and the wafer W, the treatment film is stripped in the state of “film” from the wafer W; and as a result, the particles P attached to the pattern-formed surface are stripped together with the treatment film from the wafer W (see FIG. 1C).

With this regard, for example, Japanese Patent Laid-Open Publication No. 2014-123704 discloses a substrate cleaning method, comprising forming a treatment film on a surface of a substrate by using a topcoat solution, and then removing particles on the substrate together with the treatment film by removing the treatment film. The topcoat solution is a protective film applied onto a surface of a resist film to inhibit penetration of an immersion liquid into this resist film.

In the substrate cleaning method according to the exemplary embodiment of the present disclosure, as the flow to remove the treatment film, firstly the explanation was made about the stripping of the treatment film formed on the substrate in the state of film; however, if the topcoat solution mentioned above is used, depending on the substrate having a underlayer film, such as for example, SiN (silicon nitride) and TiN (titanium nitride), sometimes the treatment film cannot be stripped fully, thereby leading to the insufficient removability of the treatment film from the substrate. In other words, depending on the substrate to be processed, the treatment film cannot be fully removed, so that there has been a possibility that the removing performance of the particles cannot be fully expressed.

Therefore, in the substrate cleaning method according to the exemplary embodiment of the present disclosure, the composition for substrate cleaning mentioned before is used as the film-forming treatment solution. The film-forming treatment solution as mentioned above has a higher removability of the treatment film from the substrate as compared with the conventional topcoat film; and thus, a high removing performance of the particles can be obtained even in the case that the substrate having a underlayer film such as the SiN film and the TiN film is a target to be processed.

Here, the evaluation results with regard to the removabilities of the conventional topcoat solution and of the film-forming treatment solution according to the exemplary embodiment of the present disclosure from the substrate will be explained by referring to FIG. 2. FIG. 2 shows the evaluation results with regard to the removabilities of the conventional topcoat solution and of the film-forming treatment solution according to the exemplary embodiment of the present disclosure from the substrate.

In FIG. 2, the study was done with regard to the case that after each of the treatment film is formed with the topcoat solution and with the film-forming treatment solution on a bare silicon wafer and on a SiN wafer (a substrate having a SiN film), DIW, i.e., pure water with a normal temperature (about 23 to 25 degrees) is supplied as the stripping treatment solvent; and the evaluation results of the removability of each of the treatment films from the substrate are shown. In FIG. 2, “Good” means that the removability of the treatment film from the substrate is 90% or more, and “Poor” means that the removability of the same is 10% or less.

As shown in FIG. 2, it can be seen that the treatment film formed with the conventional topcoat solution can be stripped from the substrate very well as far as the bare silicon wafer is a target to be processed; however, when the SiN wafer is used as a target to be processed, the treatment film cannot be sufficiently stripped from the substrate, which indicates that the removability thereof is deteriorated.

On the other hand, it can be seen that the treatment film of the film-forming treatment solution according to the exemplary embodiment of the present disclosure can be stripped very well from the substrate in any of the cases that the bare silicon wafer and the SiN wafer are targets to be processed so that a high removability can be obtained.

As shown above, in the substrate cleaning method according to the exemplary embodiment of the present disclosure, by using the film-forming treatment solution, the removability against the substrate having the underlayer film such as the SiN film can be enhanced as compared with the conventional topcoat solution. Therefore, according to the substrate cleaning method of the exemplary embodiment of the present disclosure, a higher removing performance of the particles as compared with the topcoat solution can be obtained in various substrates. Meanwhile, specific composition etc. of the film-forming treatment solution will be discussed later.

Figure 1D:
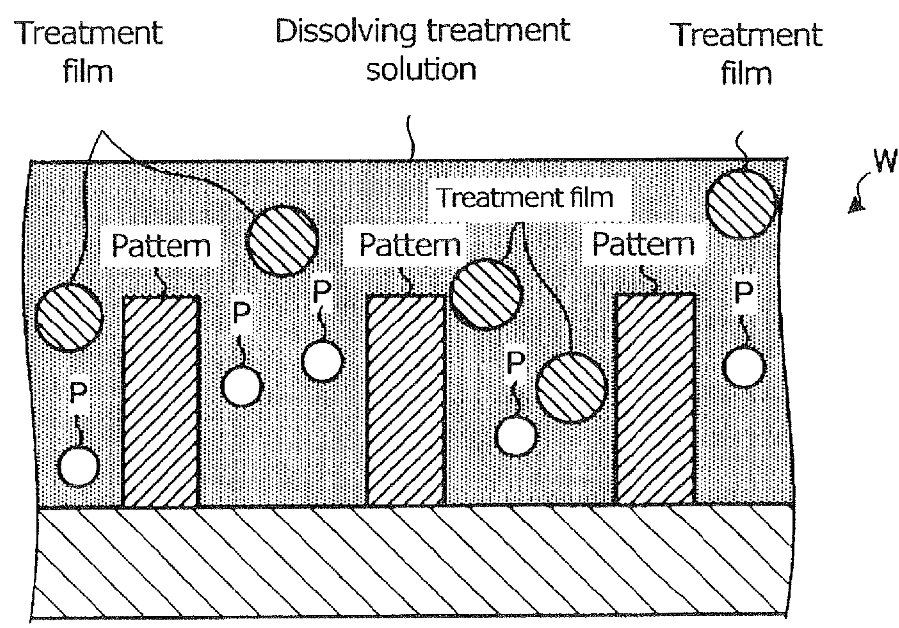
FIG. 1D is an explanatory drawing of the substrate cleaning method according to the exemplary embodiment of the present disclosure.
Figures 1E, 2:
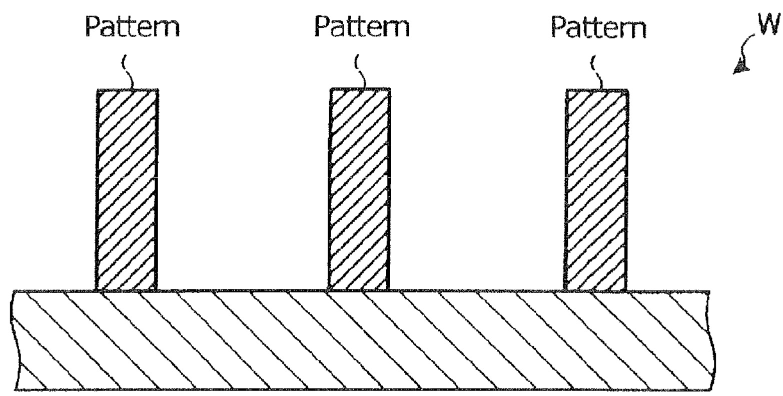
FIG. 1E is an explanatory drawing of the substrate cleaning method according to the exemplary embodiment of the present disclosure.
FIG. 2 shows evaluation results with regard to the removabilities of a conventional topcoat solution and of the film-forming treatment solution from the substrate according to the exemplary embodiment of the present disclosure.

Subsequently, as shown in FIG. 1D, to the treatment film stripped from the wafer W, a dissolving treatment solvent or solution capable of dissolving the treatment film is supplied. By so doing, the treatment film is dissolved so that the particles P incorporated into the treatment film becomes in the state of floating in the dissolving treatment solvent or solution. Thereafter, by washing out the dissolving treatment solution and the dissolved treatment film with pure water, etc., the particles P can be removed from the surface of the wafer W (see FIG. 1E).

As discussed above, in the substrate cleaning method according to the exemplary embodiment of the present disclosure, the treatment film formed on the wafer W is stripped from the wafer W in the state of the “film”, so that the particles P attached to the pattern etc. can be removed together with the treatment film from the wafer W.

Therefore, according to the substrate cleaning method of the exemplary embodiment of the present disclosure, the particle removal is effected by utilizing the formation and removal of the treatment film; and thus, erosion of the underlayer film due to an etching action etc. can be suppressed.

In addition, according to the substrate cleaning method of the exemplary embodiment of the present disclosure, the particles P can be removed by a weaker force as compared with the conventional substrate cleaning method utilizing a physical force; and thus, the pattern fall can be suppressed, too.

Moreover, according to the substrate cleaning method of the exemplary embodiment of the present disclosure, the particles P whose particle diameters are small can be removed readily; these particles having been difficult to be removed by the conventional substrate cleaning method utilizing a physical force.

Meanwhile, in the substrate cleaning method according to the exemplary embodiment of the present disclosure, the treatment film is entirely removed without performing a patterning exposure after it is formed on the wafer W. Therefore, the wafer W after cleaning becomes to the state before application of the film-forming treatment solution, namely, to the state in which the pattern-formed surface is exposed.

[Composition for Substrate Cleaning]

Next, the film-forming treatment solution mentioned above will be specifically explained. Meanwhile, hereunder, the film-forming treatment solution is also referred to as a “composition for substrate cleaning”.

The composition for substrate cleaning contains (A) an organic solvent and (B) a fluorine-containing polymer that is soluble in the organic solvent. It is preferable that the polymer (B) has a partial structure represented by the following formula (1). It is presumed that because the polymer (B) has a partial structure represented by the following formula (1) as a polar group, not only the composition for substrate cleaning can express suitable wetting and extending properties to the substrate surface but also the treatment film formed can have an affinity to the stripping treatment solution as well as a suitable dissolution rate; and thus, the treatment film can be removed promptly in the state in which the particles on the substrate surface are enclosed therein, so that a high removal efficiency can be realized.

[Formula (1)]

(1)

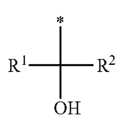

In the formula (1), $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms, and the symbol * shows a bonding site with another atom constituting the polymer.

The composition for substrate cleaning may further contain a low-molecular organic acid (hereinafter, also referred to as an "organic acid (C)"). Here, the low-molecular organic acid means an acid containing one or more carbon atoms in one molecule thereof and not having a repeating unit formed by a polymerization reaction or a condensation reaction. The molecular weight thereof is not restricted; however, it is generally in the range of 40 or more and 2000 or less. When the composition for substrate cleaning contains the organic acid (C), the composition for substrate cleaning can be removed more readily from the surface of the substrate. For example, when the treatment film is formed on a surface of a silicon nitride substrate having a SiN film as an underlayer film or on a surface of a titanium nitride substrate having a TiN film as an underlayer film, removal of the treatment film sometimes takes more time than when the treatment film is formed on a surface of a silicon substrate. By adding the organic acid (C), the time necessary to remove the treatment film can be shortened. The reason for this is not clear yet, but one possible reason might be presumed as following; for example, the treatment film formed on the surface of the substrate becomes to the state in which the organic acid (C) is dispersed in the polymer (B), thereby decreasing the strength of the treatment film to a proper strength. As a result of this, it is presumed that the treatment film can be removed more readily from the substrate, even if the substrate has a strong interaction with the polymer (B) such as, for example, a silicon nitride substrate.

In addition, besides the components (A) to (C), the composition for substrate cleaning may contain an arbitrary component so far as the effects of the present invention are not damaged.

Hereunder, each of the components will be explained.

[(A) Organic Solvent]

The organic solvent (A) is a component capable of dissolving the polymer (B). When the organic acid (C) is added, it is preferable that the organic solvent (A) can dissolve the organic acid (C).

Illustrative examples of the organic solvent (A) include organic solvents such as an alcohol solvent, an ether solvent, a ketone solvent, an amide solvent, an ester solvent, and a hydrocarbon solvent. The composition for substrate cleaning may contain a solvent other than the organic solvent (A). Illustrative examples of the solvent other than the organic solvent (A) include water.

Illustrative examples of the alcohol solvent include monovalent alcohols having 1 to 18 carbon atoms such as ethanol, isopropyl alcohol, amyl alcohol, 4-methyl-2-pentanol, cyclohexanol, 3,3,5-trimethylcyclohexanol, furfuryl alcohol, benzyl alcohol, and diacetone alcohol; divalent alcohols having 2 to 12 carbon atoms such as ethylene glycol, propylene glycol, diethylene glycol, dipropylene glycol, triethylene glycol, and tripropylene glycol; and partial ethers of them.

Illustrative examples of the ether solvent include dialkyl ether solvents such as diethyl ether, dipropyl ether, dibutyl ether, and diisoamyl ether; cyclic ether solvents such as tetrahydrofuran and tetrahydropyran; and aromatic ring-containing ether solvents such as diphenyl ether and anisole.

Illustrative examples of the ketone solvent include chain ketone solvents such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-isobutyl ketone, and trimethyl nonanone; cyclic ketone solvents such as cyclopentanone, cyclohexanone, cycloheptanone, cyclooctanone, and methyl cyclohexanone; 2,4-pentanedione; acetonyl acetone; and acetophenone.

Illustrative examples of the amide solvent include cyclic amide solvents such as N,N'-dimethylimidazolidinone and N-methylpyrrolidone; and chain amide solvents such as N-methylformamide, N,N-dimethylformamide, N,N-diethylformamide, acetamide, N-methylacetamide, N,N-dimethylacetamide, and N-methylpropionamide.

Illustrative examples of the ester solvent include monovalent alcohol carboxylate solvents such as ethyl acetate, butyl acetate, benzyl acetate, cyclohexyl acetate, and ethyl lactate; polyvalent alcohol partial ether carboxylate solvents such as a monocarboxylate of an alkylene glycol monoalkyl ether and a monocarboxylate of a dialkylene glycol monoalkyl ether; cyclic ester solvents such as butyrolactone; carbonate solvents such as diethyl carbonate; and polycarboxylate alkyl ester solvents such as diethyl oxalate and diethyl phthalate.

Illustrative examples of the hydrocarbon solvent include aliphatic hydrocarbon solvents such as n-pentane, iso-pentane, n-hexane, iso-hexane, n-heptane, iso-heptane, 2,2,4-trimethylpentane, n-octane, iso-octane, cyclohexane, and methylcyclohexane; and aromatic hydrocarbon solvents such as benzene, toluene, xylene, mesitylene, ethylbenzene, trimethylbenzene, methylethylbenzene, n-propylbenzene, iso-propylbenzene, diethybenzene, iso-butylbenzene, triethylbenzene, di-iso-propylbenzene, and n-amylnaphthalene.

As to the organic solvent (A), an alcohol solvent, an ether solvent and an ester solvent are preferable; a monoalcohol solvent, a dialkyl ether solvent and a monovalent alcohol carboxylate solvent are more preferable; and 4-methyl-2-pentanol, diisoamyl ether, propylene glycol monoethyl ether, ethoxypropanol, and ethyl lactate are still more preferable.

The content rate of water to the total of the organic solvent (A) and the water is preferably 20% or less by mass, more preferably 5% or less by mass, still more preferably 2% or less by mass, or particularly preferably 0% by mass. When the content rate of water to the total of the organic solvent (A) and the water is equal to or lower than the above-mentioned upper limit, the strength of the formed treatment film can be lowered to a proper strength, so that the removing performance of the particles can be enhanced.

The lower limit of the content of the organic solvent (A) in the composition for substrate cleaning is preferably 50% by mass, more preferably 60% by mass, or still more preferably 70% by mass. The upper limit of the content is preferably 99.9% by mass, more preferably 99% by mass, or still more preferably 95% by mass. When the content of the organic solvent (A) is between the upper limit and the lower limit as mentioned above, the performance of the composition for substrate cleaning in removing the particles attached to the silicon nitride substrate can be enhanced furthermore. The composition for substrate cleaning may contain one, or two or more of the organic solvent (A).

[(B) Polymer]

The polymer (B) is a fluorine-containing polymer that is soluble in the organic solvent (A). It is preferable that the polymer (B) has a partial structure represented by the following formula (1):

(1)

*

$R^1$—C—$R^2$

OH wherein $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms; and the symbol * shows a bonding site with another atom constituting the polymer.

Illustrative examples of the alkyl group represented by $R^1$ or $R^2$, or an alkyl group in the fluorinated alkyl group represented by $R^1$ or $R^2$ (i.e., an alkyl before being substituted with a fluorine atom) include linear or branched alkyl groups having 1 to 8 carbon atoms such as methyl, ethyl, n-propyl, isopropyl, n-butyl, isobutyl, s-butyl, t-butyl, pentyl, hexyl, heptyl and octyl groups; cycloalkyl groups having 3 to 8 carbon atoms such as cyclopropyl, cyclobutyl, cyclopentyl, cyclohexyl, cycloheptyl and cyclooctyl groups; and alkyl groups having a linear or branched moiety and a cyclic moiety and having 4 to 8 carbon atoms such as cyclopentylmethyl, cyclopentylethyl, cyclopentylpropyl, cyclohexylmethyl, and cyclohexylethyl groups.

In the fluorinated alkyl group represented by $R^1$ or $R^2$, the hydrogen atoms of the alkyl group having 1 to 8 carbon atoms may be partially substituted with a fluorine atom(s), or may be wholly substituted with fluorine atoms. It is preferable that the fluorinated alkyl group represented by $R^1$ or $R^2$ is a trifluoromethyl group.

The type of the polymer (B) is not particularly restricted as long as the polymer (B) has a fluorine atom and is soluble in the organic solvent (A); however, in view of easiness in the synthesis thereof and a high removability, a cyclic polyolefin having a fluorine atom and a poly(meth)acrylate having a fluorine atom are preferable. When a poly(meth) acrylate having a fluorine atom is used, a preferable polymer thereof includes the one having a fluorine-containing structure unit represented by the following formula (2) (hereinafter, also referred to as "structure unit (I)").

[Formula (2)]

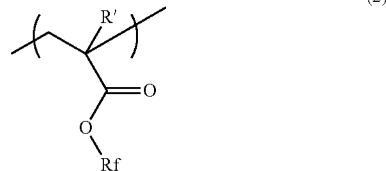

In the formula (2), R' represents a hydrogen atom, a fluorine atom, a methyl group, or a trifluoromethyl group, and Rf represents a group represented by the formula (1) or a group having a partial structure represented by the formula (1).

As to R' shown above, in view of the copolymerization ability of the monomer to give the structure unit (I), a hydrogen atom and a methyl group are preferable, though a methyl group is more preferable.

Illustrative examples of the group represented by Rf which has a partial structure represented by the formula (1) include a hydrocarbon group substituted with the group represented by the formula (1). The hydrocarbon group may be substituted with two or more of the groups represented by the formula (1). Illustrative examples of a preferable group represented by the formula (1) include a hydroxy di(trifluoromethyl)methyl group.

The hydrocarbon group may be a chain hydrocarbon group, an alicyclic hydrocarbon group, an aromatic hydrocarbon group, or a combination thereof. The chain hydrocarbon group may be linear or branched.

Illustrative examples of the chain hydrocarbon group include linear or branched alkyl groups such as methyl, ethyl, n-propyl, isopropyl, n-butyl, isobutyl, s-butyl, t-butyl, pentyl, hexyl, heptyl, octyl, nonyl and decyl groups. Illustrative examples of the alicyclic hydrocarbon group include cycloalkyl groups such as cyclopropyl, cyclobutyl, cyclopentyl, cyclohexyl, cycloheptyl, cyclooctyl, cyclononyl and cyclodecyl groups; and bridged alicyclic hydrocarbon groups resulting from removal of one hydrogen atom from norbornane, norbornene, tricyclodecane, tetracyclododecane, adamantane or the like. Illustrative examples of the aromatic hydrocarbon group include phenyl, tolyl, xylyl, biphenyl, indenyl, naphtyl, dimethyl naphtyl, anthryl, phenanthryl, fluorenyl, pyrenyl, chrysenyl and naphthacenyl groups. Illustrative examples of a combination of the chain hydrocarbon group and the cyclic hydrocarbon group include cyclopentylmethyl, cyclopentylethyl, cyclopentyipropyl, cyclohexylmethyl, cyclohexylethyl, cyclohexylpropyl, tolyl, xylyl, dimethyl naphty, benzyl, naphthylmethyl, indenylmethyl and biphenylmethyl groups. The carbon number of the linear or branched alkyl group is, for example, 1 to 20, or preferably 1 to 10. The carbon number of the cycloalkyl group is, for example, 3 to 22, or preferably 3 to 12. The carbon number of the alkyl group having a linear or branched moiety and a cyclic moiety is, for example, 4 to 23, or preferably 4 to 13.

Illustrative examples of a preferable group represented by Rf include hydroxy-substituted fluorinated chain hydrocarbon groups such as a hydroxy di(trifluoromethyl)methyl group, a hydroxy di(trifluoromethyl)ethyl group, a hydroxy di(trifluoromethyl)propyl group, and a hydroxy di(trifluoromethyl)butyl group; hydroxy-substituted fluorinated alicyclic hydrocarbon groups such as a hydroxy di(trifluoromethyl)methyl cyclopentyl group and a hydroxy di(trifluoromethyl)methyl cyclohexyl group; and hydroxy-substituted fluorinated aromatic hydrocarbon groups such as a hydroxy di(trifluoromethyl)methyl phenyl group.

As to Rf, among them, the hydroxy-substituted fluorinated chain hydrocarbon groups (i.e., alkyl groups substituted with the group represented by formula (1)) are preferable; and the hydroxy di(trifluoromethyl)butyl group is more preferable.

The content of the structure unit (I) is, relative to total structure units constituting the polymer (B), preferably in the range of 10 to 100% by mole, more preferably in the range of 50 to 100% by mole, still more preferably in the range of 90 to 100% by mole, or particularly preferably in the range of 95 to 100% by mole. When the content of the structure unit (I) is within the range mentioned above, the removability of the treatment film can be further enhanced.

The polymer (B) may further contain, as a structure unit (II), a structure unit containing a fluoroalkyl group, a structure unit containing a β-diketone structure, a structure unit containing a carboxy group, a structure unit containing a sulfo group, a structure unit containing a sulfonamide group, a structure unit derived from an alkyl(meth)acrylate, a structure unit containing a monocyclic or polycyclic lactone skeleton, a structure unit containing a hydroxy group, a structure unit containing an aromatic ring, or a structure unit containing an acid-dissociable group. When the structure unit (II) contains a fluoroalkyl group, the content of the structure unit (II) in the polymer (B) is preferably 50% or less by mole, more preferably less than 30% by mole, or particularly preferably less than 10% by mole. When the content of the structure unit (II) containing the fluoroalkyl group is more than 50% by mole, especially when the content of the structure unit (II) containing the fluoroalkyl group is more than 50% by mole and an organic acid (C) discussed later is not added, the removability of the treatment film is prone to be deteriorated.

The acid dissociation constant of the polymer (B) is preferably less than the acid dissociation constant of the organic acid (C) that will be discussed later. When the acid dissociation constant of the polymer (B) is less than that of the organic acid (C), the removability of the treatment film from the substrate surface can be enhanced furthermore. The acid dissociation constants of the polymer (B) and the organic acid (C) can be determined by a heretofore known titration method. To evaluate the relative magnitude relation between the acid dissociation constants, the values may be obtained from the calculation by using a chemical calculation software as the more convenient method than the titration method. For example, they can be calculated by using the program provided by ChemAxon Ltd.

The lower limit of the content of the polymer (B) in the composition for substrate cleaning is preferably 0.1% by mass, more preferably 0.5% by mass, or still more preferably 1% by mass. The upper limit of the content is preferably 50% by mass, more preferably 30% by mass, or still more preferably 15% by mass. When the content is between the upper limit and the lower limit as mentioned above, the removability of the treatment film from the substrate surface can be enhanced furthermore.

The lower limit of the content of the polymer (B) relative to total solid components in the composition for substrate cleaning is preferably 30% by mass, more preferably 40% by mass, or still more preferably 50% by mass. The upper limit of the content is preferably 99% by mass, more preferably 98% by mass, or still more preferably 96% by mass.

[(C) Organic Acid]

The composition for substrate cleaning may further contain (C) an organic acid. When the organic acid (C) is added, the treatment film formed on the substrate surface can be removed more readily. Preferably, the organic acid (C) is not a polymer. Here, the phrase "not a polymer" means that it does not have a repeating unit. The upper limit of the molecular weight of the organic acid (C) is, for example, 500, preferably 400, or more preferably 300. The lower limit of the molecular weight of the organic acid (C) is, for example, 50, or preferably 55.

Illustrative examples of the organic acid (C) include monocarboxylic acids such as acetic acid, propionic acid, butyric acid, pentanoic acid, hexanoic acid, cyclohexane carboxylic acid, cyclohexylacetic acid, 1-adamantane carboxylic acid, benzoic acid, and phenylacetic acid; fluorine-containing monocarboxylic acids such as difluoroacetic acid, trifluoroacetic acid, pentafluoropropionic acid, heptafluorobutyric acid, fluorophenylacetic acid, and difluorobenzoic acid; heteroatom-containing monocarboxylic acids such as 10-hydroxydecanoic acid, thiolacetic acid, 5-oxohexanoic acid, 3-methoxy cyclohexane carboxylic acid, camphor carboxylic acid, dinitrobenzoic acid, and nitrophenylacetic acid; monocarboxylic acids such as double bond-containing monocarboxylic acids including (meth)acrylic acid, crotonic acid, and cinnamic acid; polycarboxylic acids such as oxalic acid, malonic acid, succinic acid, glutaric acid, adipic acid, dodecane dicarboxylic acid, propane tricarboxylic acid, butane tetracarboxylic acid, hexafluoroglutaric acid, cyclohexane hexacarboxylic acid, and 1,4-naphthalene dicarboxylic acid; and partial esters of the polycarboxylic acids mentioned above.

The lower limit of the solubility of the organic acid (C) in water at 25° C. is preferably 5% by mass, more preferably 7% by mass, or still more preferably 10% by mass. The upper limit of the solubility is preferably 50% by mass, more preferably 40% by mass, or still more preferably 30% by mass. When the solubility is between the upper limit and the lower limit as mentioned above, the removability of the formed treatment film can be enhanced furthermore.

The organic acid (C) is preferably in the solid state at 25° C. If the organic acid (C) is in the solid state at 25° C., it is considered that the organic acid (C) in the solid state is precipitated in the treatment film formed from the composition for substrate cleaning, so that the removability thereof can be enhanced furthermore.

In order for the treatment film to be removed more readily, the organic acid (C) is preferably polycarboxylic acids, or more preferably oxalic acid, malic acid, and citric acid.

The lower limit of the content of the organic acid (C) in the composition for substrate cleaning is preferably 0.01% by mass, more preferably 0.05% by mass, or still more preferably 0.1% by mass. The upper limit of the content is preferably 30% by mass, more preferably 20% by mass, or still more preferably 10% by mass.

The lower limit of the content of the organic acid (C) relative to the total solid components in the composition for substrate cleaning is preferably 0.5% by mass, more preferably 1% by mass, or still more preferably 3% by mass. The upper limit of the content is preferably 30% by mass, more preferably 20% by mass, or still more preferably 10% by mass.

When the content of the organic acid (C) is between the upper limit and the lower limit as mentioned above, the treatment film can be removed more readily.

[Arbitrary Components]

The composition for substrate cleaning may contain an arbitrary component other than the components (A) to (C) mentioned above. Illustrative examples of the arbitrary component include surfactant, etc.

Illustrative examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate.

The content of the surfactant mentioned above is usually 2% or less by mass, or preferably 1% or less by mass.

[Structure of the Substrate Cleaning System]

Figure 3:
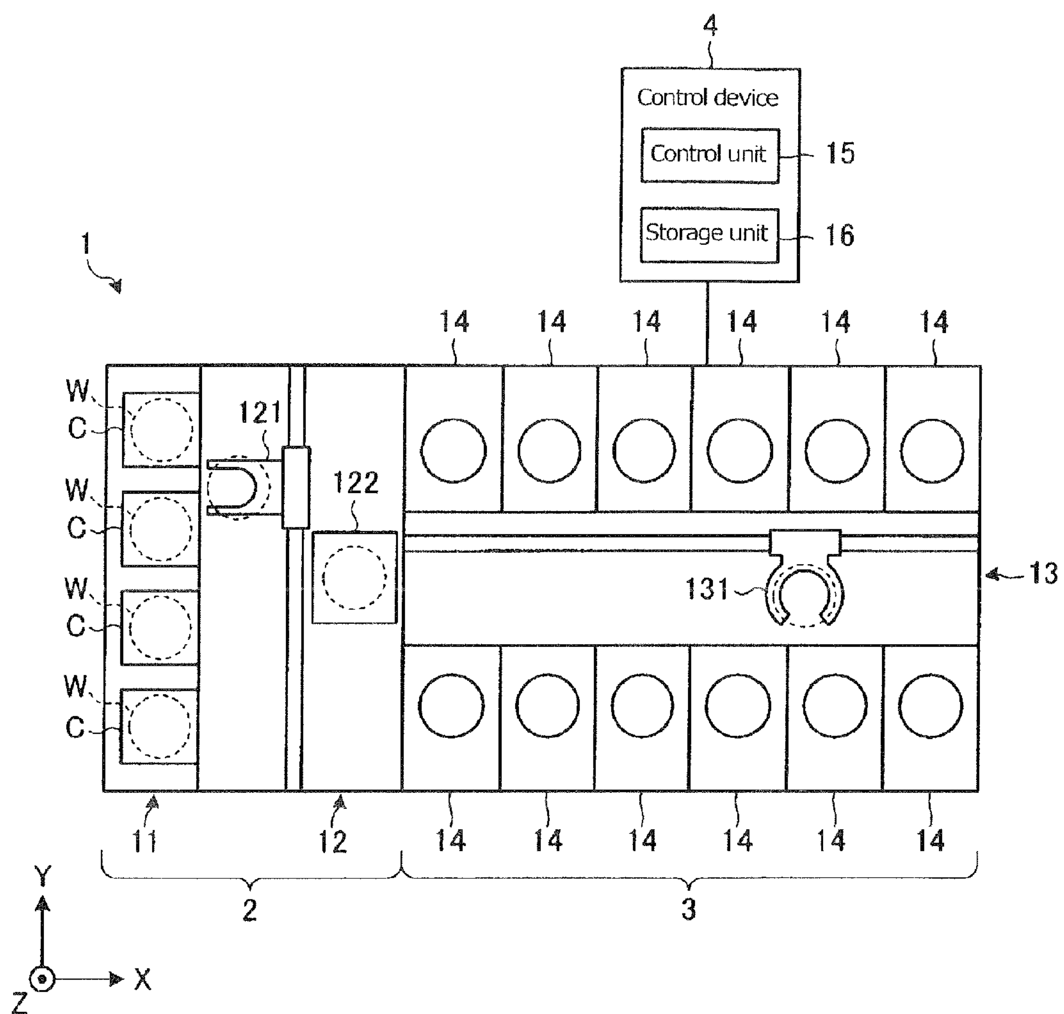
FIG. 3 is a schematic diagram illustrating a structure of the substrate cleaning system according to the exemplary embodiment of the present disclosure.

Next, the structure of the substrate cleaning system according to the exemplary embodiment of the present disclosure will be explained by using FIG. 3. FIG. 3 is a schematic diagram illustrating the structure of the substrate cleaning system according to the exemplary embodiment of the present disclosure. In the following, in order to clarify positional relationships, the X-axis, Y-axis, and Z-axis which are orthogonal to each other will be defined. The positive Z-axis direction will be regarded as a vertically upward direction.

As shown in FIG. 3, a substrate cleaning system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of transfer vessels (hereinafter, referred to as “carriers C”) are placed to accommodate a plurality of wafers W horizontally.

The transfer section 12 is provided adjacent to the carrier placing section 11. Inside the transfer section 12, a substrate transfer device 121 and a delivery unit 122 are provided.

The substrate transfer device 121 is provided with a wafer holding mechanism configured to hold the wafer W. Further, the substrate transfer device 121 is movable horizontally and vertically and pivotable around a vertical axis, and transfers the wafer W between the carrier C and the delivery unit 122 by using the wafer holding mechanism.

The processing station 3 is provided adjacent to the transfer section 12. The processing station 3 is provided with a transfer section 13 and a plurality of substrate cleaning devices 14. The plurality of substrate cleaning devices 14 are arranged at both sides of the transfer section 13.

The transfer section 13 is provided with a substrate transfer device 131 therein. The substrate transfer device 131 is provided with a wafer holding mechanism configured to hold the wafer W. Further, the substrate transfer device 131 is movable horizontally and vertically and pivotable around a vertical axis, and transfers the wafer W between the delivery unit 122 and the substrate cleaning devices 14 by using the wafer holding mechanism.

The substrate cleaning device 14 is a device configured to perform the substrate cleaning process based on the substrate cleaning method mentioned above. The specific structure of the substrate cleaning device 14 will be discussed later.

Further, the substrate cleaning system 1 is provided with a control device 4. The control device 4 is a device configured to control the operation of the substrate cleaning system 1. The control device 4 is, for example, a computer, and includes a control unit 15 and a storage unit 16. The storage unit 16 stores a program that controls various processes such as the substrate cleaning process. The control unit 15 controls the operation of the substrate cleaning system 1 by reading and executing the program stored in the storage unit 16. The control unit 15 comprises, for example, CPU (Central Processing Unit) and MPU (Micro Processor Unit); and the storage unit 16 comprises, for example, ROM (Read Only Memory) and RAM (Random Access Memory).

Meanwhile, the program may be recorded in a computer-readable recording medium, and installed from the recoding medium to the storage unit 16 of the control device 4. The computer-readable recording medium may be, for example, a hard disk (HD), a flexible disk (FD), a compact disc (CD), a magnet optical disc (MO), or a memory card.

In the substrate cleaning system 1 configured as described above, the substrate transfer device 121 of the carry-in/out station 2 first takes out a wafer W from the carrier C, and then places the taken wafer W on the delivery unit 122. The wafer W placed on the delivery unit 122 is taken out from the delivery unit 122 by the substrate transfer device 131 of the processing station 3 and carried into the substrate cleaning device 14; and then, the substrate cleaning process is performed by the substrate cleaning device 14. The wafer W after being cleaned is carried out from the substrate cleaning device 14 by the substrate transfer device 131, and then placed on the delivery unit 122, and then returned to the carrier C by the substrate transfer device 121.

[Structure of the Substrate Cleaning Device]

Figure 4:
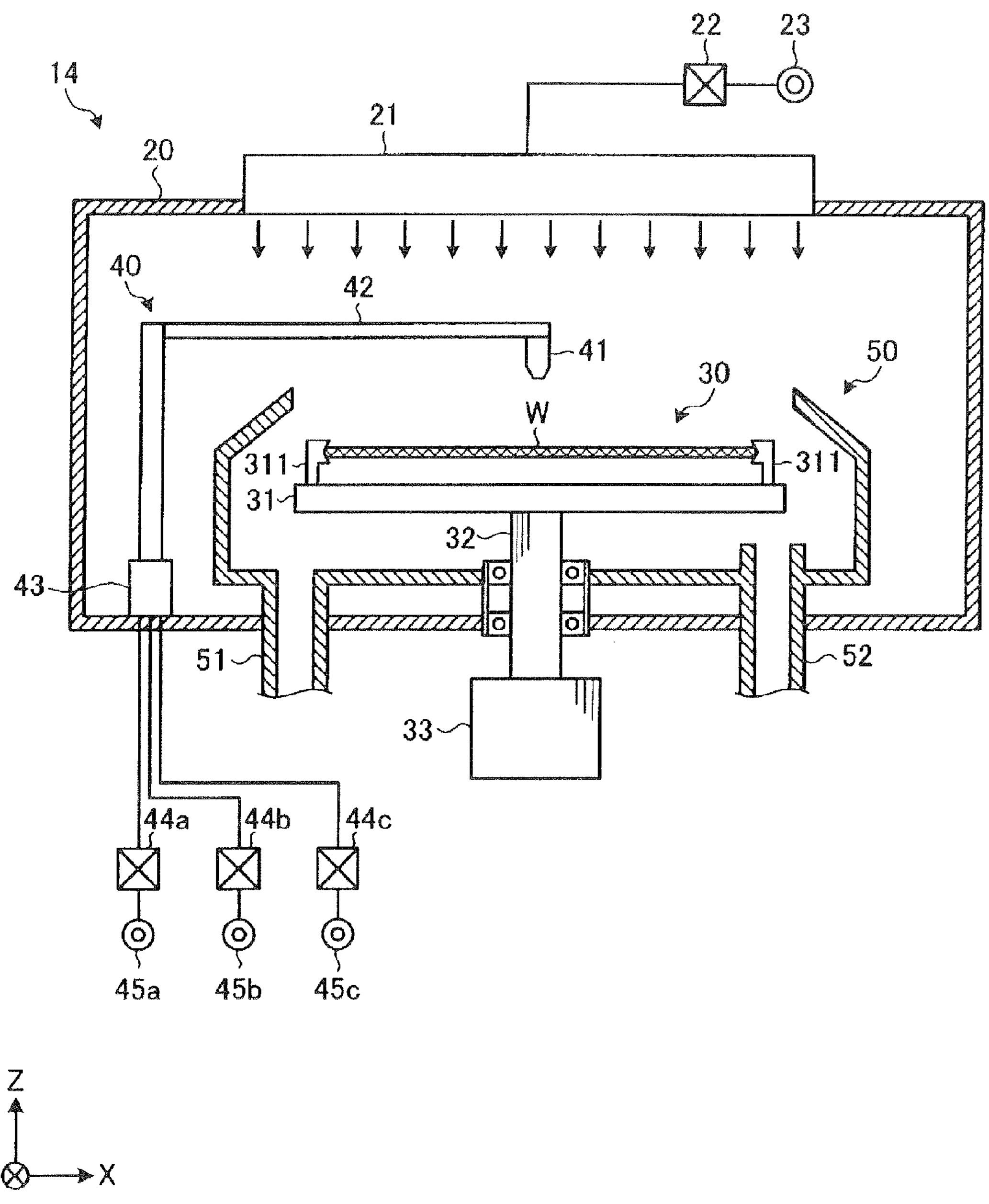
FIG. 4 is a schematic diagram illustrating a structure of the substrate cleaning device according to the exemplary embodiment of the present disclosure.

Next, the structure of the substrate cleaning device 14 will be explained by referring to FIG. 4. FIG. 4 is a schematic diagram illustrating the structure of the substrate cleaning device 14 according to the exemplary embodiment of the present disclosure.

As shown in FIG. 4, the substrate cleaning device 14 is provided with a chamber 20, a substrate holding mechanism 30, a solution supply unit 40, and a recovery cup 50.

The chamber 20 accommodates the substrate holding mechanism 30, the solution supply unit 40, and the recovery cup 50. On the ceiling of the chamber 20, a FFU (Fan Filter Unit) 21 is provided. The FFU 21 forms a downflow in the chamber 20.

The FFU 21 is connected to a downflow gas source 23 via a valve 22. The FFU 21 discharges a downflow gas (for example, a dry air) supplied from the downflow gas source 23 into the chamber 20.

The substrate holding mechanism 30 is provided with a rotation holding unit 31, a support unit 32, and a driving unit 33. The rotation holding unit 31 is arranged in an almost central part of the chamber 20. Above the rotation holding unit 31 is arranged a holding member 311 configured to hold the wafer W from the side thereof. The wafer W is held horizontally by the holding member 311 above the rotation holding unit 31 with a small space from it.

The support unit 32 is a member extended vertically whose base end portion is held rotatably by the driving unit 33 while holding the rotation holding unit 31 horizontally in its tip end portion. The driving unit 33 rotates the support unit 32 around the vertical axis.

By rotating the support unit 32 by using the driving unit 33, the substrate holding mechanism 30 rotates the rotation holding unit 31 supported by the support unit 32, thereby rotating the wafer W held on the rotation holding unit 31.

A solution supply unit 40 supplies various treatment solutions to the wafer W held on the substrate holding mechanism 30. The solution supply unit 40 is provided with a nozzle 41, an arm 42 configured to hold the nozzle 41 horizontally, and a pivoting, raising and lowering mechanism 43 to pivot, raise and lower the arm 42.

The nozzle 41 is connected to each of a film-forming treatment solution source 45*a*, a DIW source 45*b*, and an alkaline aqueous solution source 45*c* via valves 44*a* to 44*c*, respectively. Meanwhile, in the exemplary embodiment of the present disclosure, the number of the nozzle 41 in the solution supply unit 40 is one; however, two or more nozzles may be installed. For example, four nozzles may be installed in order to separately supply each of the different treatment solutions.

The solution supply unit 40 is configured as mentioned above and supplies the film-forming treatment solution (the composition for substrate cleaning), DIW, or the alkaline aqueous solution to the wafer W.

DIW is one example of the stripping treatment solvent capable of stripping the treatment film from the wafer W. Meanwhile, DIW is used also as a rinsing treatment solvent in a rinsing process after the dissolving treatment solution supplying process which will be discussed later.

The alkaline aqueous solution is one example of the dissolving treatment solution capable of dissolving the treatment film. The alkaline aqueous solution is, for example, an alkaline developing solution. As to the alkaline developing solution, any solution will do so long as it contains at least one of, for example, water mixed with an aqueous ammonia, water mixed with a quaternary ammonium hydroxide rinsing treatment solvent in a rinsing process after the dissolving treatment solution supplying process which will be discussed later.

The alkaline aqueous solution is one example of the dissolving treatment solution capable of dissolving the treatment film. The alkaline aqueous solution is, for example, an alkaline developing solution. As to the alkaline developing solution, any solution will do so long as it contains at least one of, for example, water mixed with an aqueous ammonia, water mixed with a quaternary ammonium hydroxide such as tetramethyl ammonium hydroxide (TMAH), and water mixed with a choline.

The recovery cup 50 is arranged such that it surrounds the rotation holding unit 31, so that the treatment solution scattered from the wafer W by rotation of the rotation holding unit 31 can be collected. On the bottom of the recovery cup 50 is formed a drain port 51; and the treatment solution collected by the recovery cup 50 is discharged to outside the substrate cleaning device 14 through the drain port 51. Further, in the bottom part of the recovery cup 50 is formed an exhaust port 52 configured to discharge the downflow gas supplied from the FFU 21 to outside the substrate cleaning device 14.

[Specific Operation of the Substrate Cleaning System]

Figure 5:
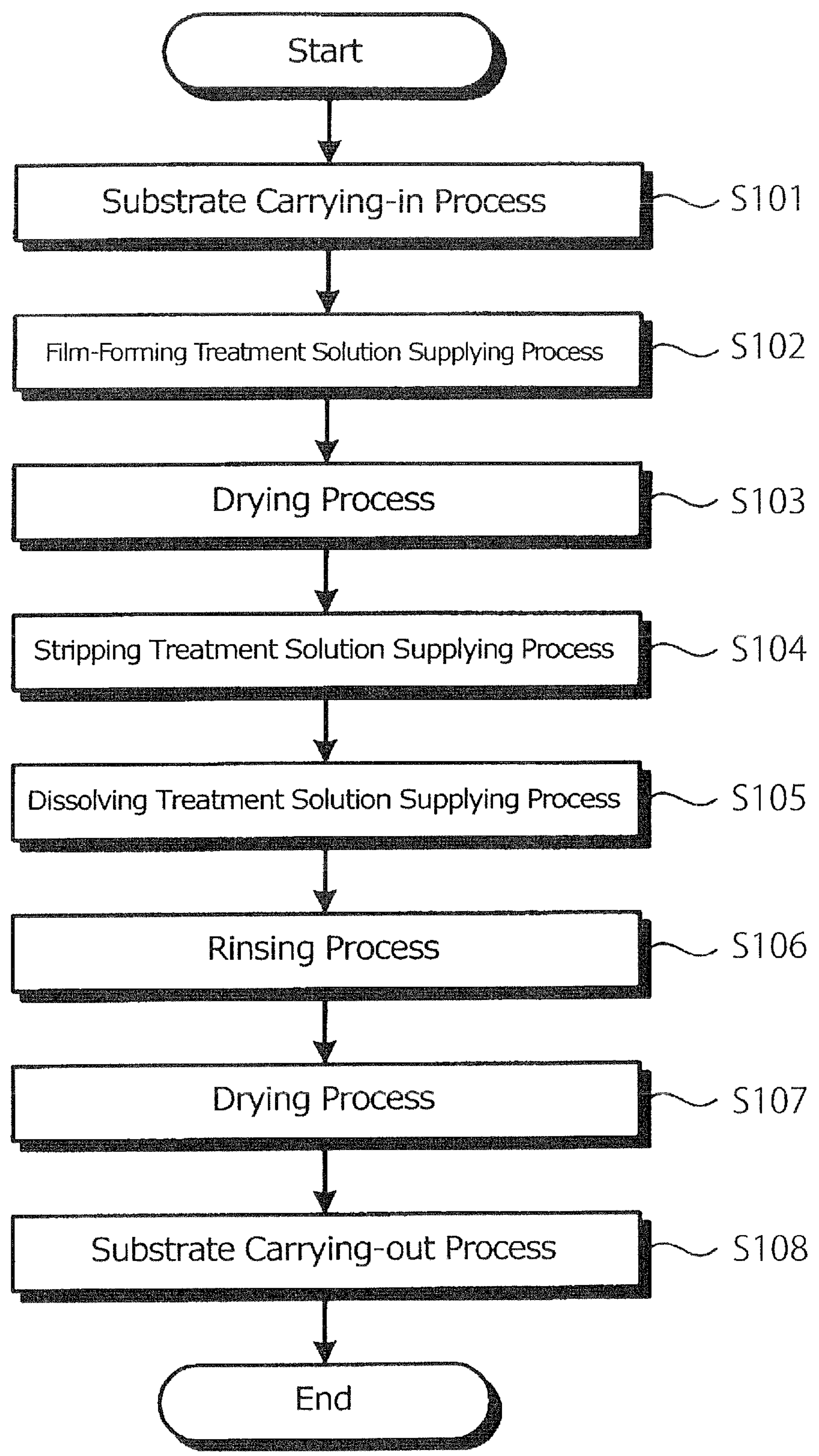
FIG. 5 is a flow chart showing a processing procedure of the substrate cleaning process performed by the substrate cleaning device according to the exemplary embodiment of the present disclosure.

Next, the specific operation of the substrate cleaning device 14 will be explained by referring to FIG. 5. FIG. 5 is a flow chart showing a processing procedure of the substrate cleaning process performed by the substrate cleaning system 1 according to the exemplary embodiment of the present disclosure. Each of the devices provided in the substrate cleaning system 1 performs each processing procedure shown in FIG. 5 by control of the control unit 15.

Hereunder, the explanation will be made as to the substrate cleaning process when any of the compositions of Examples 12 to 16 discussed later is used as the film-forming treatment solution.

As shown in FIG. 5, in the substrate cleaning device 14, at first, a substrate carrying-in process is performed (step S101). In this substrate carrying-in process, the wafer W which is carried into the chamber 20 by the substrate transfer device 131 (see FIG. 3) is held by the holding member 311 of the substrate holding mechanism 30. At this time, the wafer W is held to the holding member 311 in such a state that the pattern-formed surface may be faced upward. Thereafter, the rotation holding unit 31 rotates by the driving unit 33. By so doing, the wafer W rotates together with the rotation holding unit 31 while it is held horizontally to the rotation holding unit 31.

Subsequently, in the substrate cleaning device 14, a film-forming treatment solution supplying process is performed (step S102). In this film-forming treatment solution supplying process, the nozzle 41 of the solution supply unit 40 is placed above the center of the wafer W. Thereafter, by opening the valves 44*a* for a prescribed period of time, the film-forming treatment solution is supplied to the pattern-formed surface of the wafer W not formed with a resist. In this way, the film-forming treatment solution is supplied onto the wafer W without intervened by the resist.

The film-forming treatment solution supplied to the wafer W is spread on the surface of the wafer W by a centrifugal force generated by the rotation of the wafer W. In this way, a liquid film of the film-forming treatment solution is formed on the pattern-formed surface of the wafer W. The film thickness of the treatment film to be formed is preferably in the range of 10 to 5,000 nm, or more preferably in the range of 20 to 500 nm.

Subsequently, in the substrate cleaning device 14, a drying process is performed (step S103). In this drying process, the film-forming treatment solution is dried, for example, by increasing the rotation speed of the wafer W during a prescribed period of time. In this way, for example, part or all of the organic solvent contained in the film-forming treatment solution is evaporated so that the solid components contained in the film-forming treatment solution are solidified or cured, thereby the treatment film is formed on the pattern-formed surface of the wafer W.

Meanwhile, though not shown by the drawing, the drying process of the step S103 may be, for example, the process wherein inside the chamber 20 is brought to the state of a reduced pressure by means of a vacuuming device, or the process wherein the humidity inside the chamber 20 is lowered by the downflow gas supplied from the FFU 21. With these processes too, the film-forming treatment solution may be solidified or cured.

Alternatively, in the substrate cleaning device 14, the wafer W may be allowed to stand in the substrate cleaning device 14 until the film-forming solution is solidified or cured naturally. Further alternatively, by stopping the rotation of the wafer W, or by rotating the wafer W with the rotation speed at which the surface of the wafer W is not exposed by spinning out the film-forming treatment solution, the film-forming treatment solution may be solidified or cured.

Subsequently, in the substrate cleaning device 14, a stripping treatment solution supplying process is performed (step S104). In this stripping treatment solution supplying process, by opening the valve 44*b* for a prescribed period of time, DIW, which is a stripping treatment solvent, is supplied to the treatment film formed on the wafer W. DIW supplied to the treatment film is spread on the treatment film by a centrifugal force generated by rotation of the wafer W.

DIW is penetrated into the treatment film and reaches the interface between the treatment film and the wafer W, whereby stripping the treatment film from the wafer W. In this way, the particles P attached to the pattern-formed surface of the wafer W are removed from the wafer W together with the treatment film.

Here, as mentioned above, the film-forming treatment solution contains the organic solvent and the fluorine-containing polymer that is soluble in the organic solvent (preferably, the polymer having the partial structure represented by the formula (1)). By using the film-forming treatment solution like this, the removability of the treatment film from the wafer W is enhanced, so that the removing performance of the particles P on the wafer W can be enhanced.

Further, because the film-forming treatment solution has a high removability of the treatment film, it is conceived that this can be applied to substrates formed of various materials. Illustrative examples of the applicable substrate include metal or semi-metal substrates such as a silicon substrate, an aluminum substrate, a nickel substrate, a chromium substrate, a molybdenum substrate, a tungsten substrate, a copper substrate, a tantalum substrate, and a titanium substrate; and ceramic substrates such as a silicon nitride substrate, an alumina substrate, a silicon dioxide substrate, a tantalum nitride substrate, and a titanium nitride substrate. Among them, a silicon substrate, a silicon nitride substrate, and a titanium nitride substrate are preferable; however, a silicon nitride substrate is more preferable.

Subsequently, in the substrate cleaning device 14, a dissolving treatment solution supplying process is performed (step S105). In this dissolving treatment solution supplying process, by opening the valve 44*c* for a prescribed period of time, the alkaline aqueous solution, which is a dissolving treatment solution, is supplied to the treatment film stripped from the wafer W. In this way, the treatment film is dissolved.

Here, as the dissolving treatment solvent or solution, for example, an organic solvent such as a thinner and an alkaline aqueous solution such as an alkaline developing solution may be used. Meanwhile, when the alkaline aqueous solution is used as the dissolving treatment solution, the zeta potential having the same polarity in the wafer W and the particles P can be generated. With this, the wafer W and the particles P repel with each other, so that reattachment of the particles P to the wafer W can be avoided. The stripping treatment solution supplying process of the step S104 and the dissolving treatment solution supplying process of the step S105 correspond to one example of the removing solution supply step of supplying to the treatment film formed on the substrate by solidification or curing of the film-forming treatment solution, the removing solution capable of removing the treatment film.

Subsequently, in the substrate cleaning device 14, a rinsing process is performed (step S106). In this rinsing process, by opening the valve 44*b* for a prescribed period of time, DIW is supplied as a rinsing solution to the rotating wafer W. In this way, the dissolved treatment film and the particles P floating in the alkaline aqueous solution are removed from the wafer W together with DIW.

Subsequently, in the substrate cleaning device 14, a drying process is performed (step S107). In this drying process, for example, by increasing the rotation speed of the wafer W during a prescribed period of time, DIW which is left on the surface of the wafer W is span off to dry the wafer W. Thereafter, the rotation of the wafer W is stopped.

Subsequently, in the substrate cleaning device 14, a substrate carrying-out process is performed (step S108). In this substrate carrying-out process, by means of the substrate transfer device 131 (see FIG. 3), the wafer W is taken out from the chamber 20 of the substrate cleaning device 14. Thereafter, the wafer W is accommodated in the carrier C which is placed in the carrier placing section 11 via the delivery unit 122 as well as the substrate transfer device 121. When the substrate carrying-out process is over, the substrate cleaning process of the wafer W (i.e., the substrate cleaning process of one wafer) is completed.

As discussed above, the substrate cleaning method according to the exemplary embodiment of the present disclosure comprises the film-forming treatment solution supply step and the removing solution supply step. In the film-forming treatment solution supply step, the film-forming treatment solution containing the organic solvent and the fluorine-containing polymer that is soluble in the organic solvent (more preferably, the polymer having the partial structure represented by the formula (1) as mentioned above) is supplied to the substrate. In the film-forming treatment solution supply step (corresponding to the stripping treatment solution supplying process and the dissolving treatment solution supplying process), the removing solution (corresponding to the stripping treatment solution and the dissolving treatment solution) capable of removing the treatment film is supplied to the treatment film formed by solidification or curing of the film-forming treatment solution on the substrate.

Therefore, according to the substrate processing system 1 of the exemplary embodiment of the present disclosure, a high removing performance of the particles can be obtained.

[Other Exemplary Embodiments]

In the exemplary embodiments discussed above, the film-forming treatment solution supplying process and the dissolving treatment solution supplying process are performed in the same chamber; however, alternatively, the film-forming treatment solution supplying process and the dissolving treatment solution supplying process may be performed in different chambers. In this case, for example, a first substrate cleaning device configured to perform the step S101 (substrate carrying-in process) to step S103 (drying process) shown in FIG. 5 and a second substrate cleaning device configured to perform the step S104 (stripping treatment solution supplying process) to step S108 (substrate carrying-out process) shown in FIG. 5 may be arranged in the processing station 3 shown in FIG. 3. Further alternatively, the stripping treatment solution supplying process and the dissolving treatment solution supplying process may be performed in different chambers.

In the exemplary embodiments discussed above, the examples wherein DIW in the liquid state is used as the stripping treatment solvent have been explained; however, the stripping treatment solvent may be DIW in the mist state as well.

Further, in the exemplary embodiments discussed above, the examples wherein DIW is supplied directly to the treatment film by using the nozzle have been explained; however, by raising the humidity in the chamber by using, for example, a humidifier, DIW may be supplied indirectly to the treatment film.

Further, in the exemplary embodiments discussed above, the examples wherein DIW which is pure water with a normal temperature is used as the stripping treatment solvent have been explained; however, for example, a heated pure water may be used as the stripping treatment solvent as well. With this, the removing performance of the treatment film can be enhanced furthermore.

Further, in the exemplary embodiments discussed above, the examples wherein DIW is used as the stripping treatment solvent have been explained. However, as far as the process wherein the treatment film formed on the wafer W is stripped without dissolving it (or before dissolving it) is feasible, any stripping treatment solvent or solution may be used. For example, the stripping treatment solvent or solution containing at least one of a pure water mixed with $CO_2$ (DIW mixed with $CO_2$ gas), water to which a surfactant is added, a fluorine-based solvent such as HFE (hydrofluoroether), and diluted IPA (IPA (isopropyl alcohol) diluted with pure water) may be used.

Further, in the substrate cleaning device, before performing the film-forming treatment solution supplying process, as a solvent having an affinity with the film-forming treatment solution, for example, MIBC (4-methyl-2-pentanol) may be supplied to the wafer W. MIBC is contained in the film-forming treatment solution so that it has an affinity with the film-forming treatment solution. Meanwhile, as the solvent having an affinity with the film-forming treatment solution other than MIBC, for example, PGME (propylene glycol monomethyl ether), PGMEA (propylene glycol monomethyl ether acetate), etc. may be used as well.

By spreading MIBC having an affinity with the film-forming treatment solution on the wafer W in advance in the way as mentioned above, in the film-forming treatment solution supplying process, the film-forming treatment solution not only can be spread readily on the surface of the wafer W but also can be penetrated readily into the space between the patterns. Accordingly, not only the use amount of the film-forming treatment solution can be reduced but also the particles P entered into the space between the patterns can be removed more surely. In addition, the processing time of the film-forming treatment solution supplying process can be made shorter.

In all the exemplary embodiments discussed above, the explanation was made with regard to the examples in which an alkaline developing solution is used as the dissolving treatment solution supplying process; however, the dissolving treatment solution may also be the alkaline developing solution to which a hydrogen peroxide is added. By adding the hydrogen peroxide to the alkaline developing solution as mentioned above, the surface-roughing of the surface of the wafer W due to the alkaline developing solution may be suppressed.

Further, the dissolving treatment solvent or solution may be an organic solvent such as MIBC (4-methyl-2-pentanol), a thinner, toluene, acetate esters, alcohols, and glycols (propylene glycol monomethyl ether), or an acidic developing solvent such as acetic acid, formic acid, and hydroxyacetic acid.

Furthermore, the dissolving treatment solvent or solution may be supplied with a surfactant. Because the surfactant can weaken a surface tension force, reattachment of the particles P to the wafer W etc. can be suppressed. Unwanted substances to be removed may include not only the particles P but also, for example, a substance such as a polymer which is left on the substrate after dry etching or after ashing.

EXAMPLES

Next, Examples of the composition for substrate cleaning will be explained.

The weight-average molecular weight (Mw) and the number-average molecular weight (Mn) of the obtained polymer were measured by using the GPC column (manufactured by Tosoh Corp.; two columns of G2000 HXL, one column of G3000 HXL, and one column of G4000 HXL), with the flow rate of 1.0 mL/minute, the eluting solvent of tetrahydrofuran, the sample concentration of 1.0% by mass, the sample injection amount of 100 μL, the column temperature of 40° C., and the detector of a differential refractometer, based on the gel permeation chromatography (GPC) by using the monodisperse polystyrene as the standard. The dispersity (Mw/Mn) was calculated from the measurement results of Mw and Mn.

[Synthesis of Polymers]

Compounds used as the raw materials of the polymers are shown below.

(M-1)

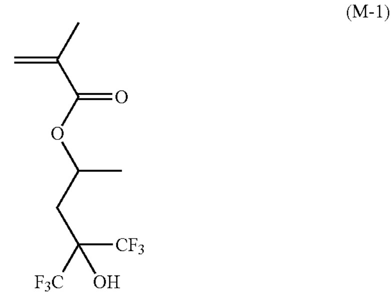

(M-2)

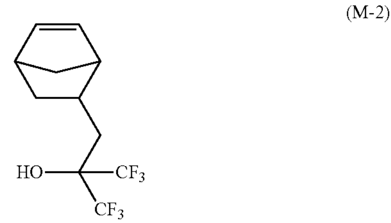

(M-3)

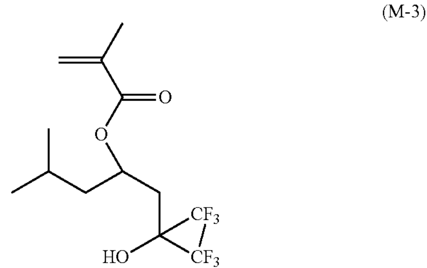

(M-4)

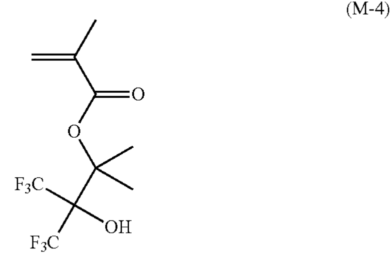

(M-5)

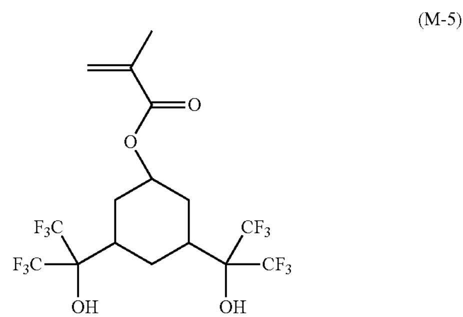

-continued

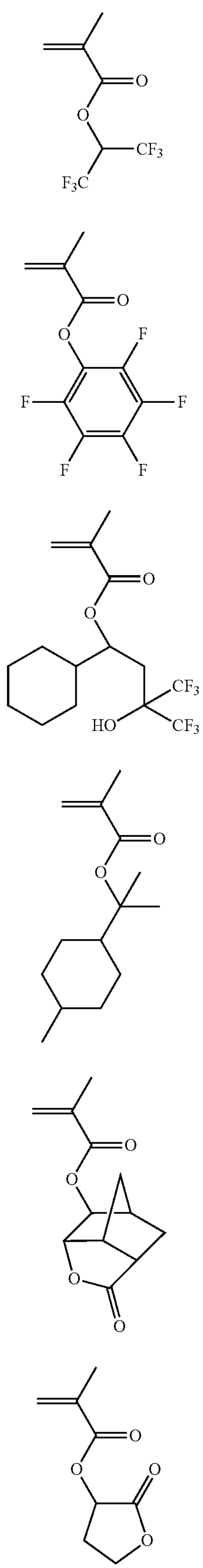

-continued

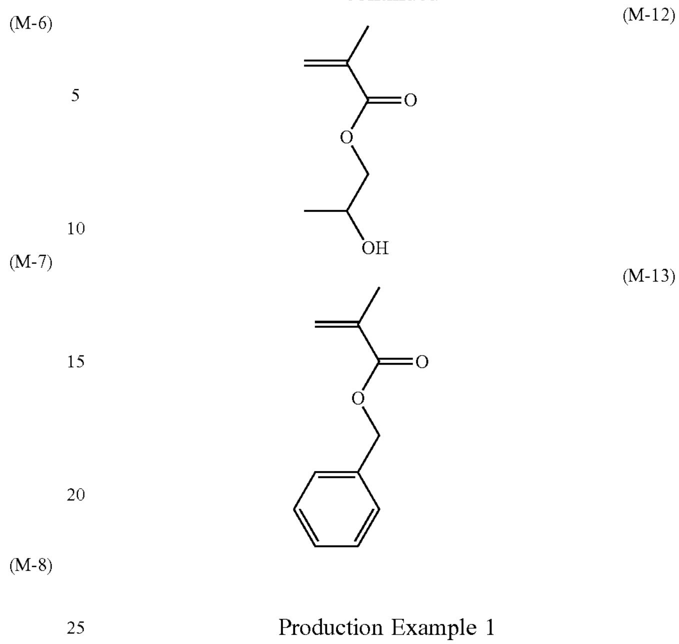

Production Example 1

A monomer solution was prepared by dissolving 100 g (100% by mole) of the compound (M-1) and 7.29 g (7% by mole) of azobis-iso-butyronitrile (AIBN) into 100 g of 2-butanone. A 1000-mL three-necked flask charged with 100 g of 2-butanone was purged with a nitrogen gas for 30 minutes. After the nitrogen purge, the flask was heated to 80° C.; and then, the monomer solution was gradually dropped by using a dropping funnel with stirring for the period of 3 hours. By taking the start of the dropping as the starting time of the polymerization, the polymerization was carried out for 6 hours. After the polymerization, the reaction solution was cooled to 30° C. or lower. The reaction solution was concentrated under reduced pressure until the mass thereof reached 150 g. Then, 150 g of methanol and 750 g of n-hexane were added for the phase separation. After the separation, the lower phase was recovered. To the recovered lower phase, 750 g of n-hexane was added; and again the phase separation was carried out for purification. After the separation, the lower phase was recovered. From the recovered lower phase, the solvent was removed, and then 4-methyl-2-pentanol was added to obtain a solution containing the resin (P-1). The results thereof are shown in Table 1.

Production Examples 2 to 10

Production Example 1 was repeated, except that the compounds to be used and the combination thereof were changed in accordance with those shown in Table 1, to obtain the resins (P-2) to (P-10).

TABLE 1

| Production Example | Resin | Composition ratio (mol %) | Yield (%) | Weight-average molecular weight (Mw) | Dispersity |
|---|---|---|---|---|---|
| 1 | P-1 | M-1(100) | 80 | 10,500 | 1.52 |
| 2 | P-2 | M-2(100) | 79 | 10,400 | 1.51 |
| 3 | P-3 | M-3(100) | 80 | 10,000 | 1.55 |
| 4 | P-4 | M-4/M-5(70/30) | 80 | 10,520 | 1.53 |
| 5 | P-5 | M-1/M-6(90/10) | 81 | 9,900 | 1.5 |
| 6 | P-6 | M-4/M-6(80/20) | 78 | 10,200 | 1.51 |

TABLE 1-continued

| Production Example | Resin | Composition ratio (mol %) | Yield (%) | Weight-average molecular weight (Mw) | Disper-sity |
|---|---|---|---|---|---|
| 7 | P-7 | M-6/M-8(50/50) | 79 | 10,450 | 1.52 |
| 8 | P-8 | M-3/M-6(70/30) | 82 | 10,000 | 1.52 |
| 9 | P-9 | M-9/M-10(50/50) | 84 | 7,400 | 1.35 |
| 10 | P-10 | M-11/M-12/M-13 (30/40/30) | 90 | 80,000 | 1.85 |

Example 1

A homogeneous solution was prepared by mixing 100 parts by mass of the polymer (P-1) and 7,400 parts by mass of 4-methyl-2-pentanol. This solution was filtrated by using a filter made of HDPE (PhotoKleen EZD, manufactured by Nippon Pall Corp.; pore diameter of 5 nm). It was confirmed that the number of the particles with the size of 150 μm or less in the solution was decreased to 10 particles/mL by the solution particle counter (KS-41B, manufactured by RION Co., Ltd.) to obtain the composition for substrate cleaning (D-1). The solid content concentration thereof was about 1.5%.

Examples 2 to 8 and Comparative Examples 1 and 2

Example 1 was repeated except that the resin was changed to those shown in Table 2 to obtain the compositions for substrate cleaning (D-2) to (D-8) and the comparative compositions (c-1) and (c-2).

Example 9

A homogeneous solution was prepared by mixing 100 parts by mass of the polymer (P-1), 5.0 parts by mass of tartaric acid (Ac-1) as an organic acid, and 7,400 parts by mass of 4-methyl-2-pentanol. This solution was filtrated by using a filter made of HDPE (PhotoKleen EZD, manufactured by Nippon Pall Corp.; pore diameter of 5 nm). It was confirmed that the number of the particles with the size of 150 μm or less in the solution was decreased to 10 particles/mL by the solution particle counter (KS-41B, manufactured by RION Co., Ltd.) to obtain the composition for substrate cleaning (D-1). The solid content concentration thereof was about 1.5%.

Examples 10 to 16 and Comparative Examples 3 to 5

Example 9 was repeated except that the resin and the organic acid were changed to those shown in Table 2 to obtain the compositions for substrate cleaning (D-10) to (D-16) and the comparative compositions (c-3) to (c-5).

TABLE 2

| | | Resin | | Organic acid | |
|---|---|---|---|---|---|
| Run | Composition | Kind | Parts by mass | Kind | Parts by mass |
| Example 1 | D-1 | P-1 | 100 | — | — |
| Example 2 | D-2 | P-2 | 100 | — | — |
| Example 3 | D-3 | P-3 | 100 | — | — |
| Example 4 | D-4 | P-4 | 100 | — | — |
| Example5 | D-5 | P-5 | 100 | — | — |
| Example 6 | D-6 | P-6 | 100 | — | — |
| Example 7 | D-7 | P-7 | 100 | — | — |
| Example 8 | D-8 | P-8 | 100 | — | — |
| Example 9 | D-9 | P-1 | 100 | Ac-1 | 5 |
| Example 10 | D-10 | P-2 | 100 | Ac-2 | 5 |
| Example 11 | D-11 | P-3 | 100 | Ac-3 | 5 |
| Example 12 | D-12 | P-4 | 100 | Ac-4 | 5 |
| Example 13 | D-13 | P-5 | 100 | Ac-5 | 5 |
| Example 14 | D-14 | P-6 | 100 | Ac-6 | 5 |
| Example 15 | D-15 | P-7 | 100 | Ac-7 | 5 |
| Example 16 | D-16 | P-8 | 100 | Ac-8 | 5 |
| Comparative Example 1 | c-1 | P-9 | 100 | — | — |
| Comparative Example 2 | c-2 | P-10 | 100 | — | — |
| Comparative Example 3 | c-3 | P-9 | 100 | Ac-1 | 5 |
| Comparative Example 4 | c-4 | P-9 | 100 | Ac-9 | 5 |
| Comparative Example 5 | c-5 | P-10 | 100 | Ac-2 | 5 |

The organic acids used in each of Examples and Comparative Examples are shown below. In these Examples, all the organic acids are the reagents manufactured by Wako Pure Chemical Industries, Ltd.

Ac-1: tartaric acid
Ac-2: oxalic acid
Ac-3: citric acid
Ac-4: maleic acid
Ac-5: malic acid
Ac-6: fumaric acid
Ac-7: isophthalic acid
Ac-8: terephthalic acid
Ac-9: polyacrylic acid (Polyacrylic acid 5000, manufactured by Wako Pure Chemical Industries, Ltd.)

[Evaluation of the Particle Removability and the Film Removability]

On the 12-inch wafer previously attached with silica particles having the particle diameter of 200 nm was formed the treatment film of each composition by a spin coating method by using the substrate cleaning device 14. To the wafer formed with the treatment film, a tetramethyl ammonium hydroxide aqueous solution (TMAH solution) with the concentration of 2.38% by mass was supplied as a dissolving treatment solution to remove the treatment film. The removability thereof was judged as "A" if removal of all the treatment film was completed within 20 seconds from the start of the supply of the TMHA solution, as "B" if the removal was completed over 20 seconds and within 1 minute, and as "C" if the removal was not completed within 1 minute. Further, the number of the silica particles remained on the wafer after removal of the treatment film was analyzed by using a dark field defect inspection device (SP2, manufactured by KLA-Tencor Corp.). It was judged as "A" if the removing rate of the silica particles was 70% or more, as "B" if the removing rate was 30% or more and less than 70%, and as "C" if the removing rate was less than 30%. Meanwhile, if the treatment film could not be formed, the description of "Inapplicable" was made in the particle removability column.

Evaluation Examples 1 to 16 and Comparative Evaluation Examples 1 to 5

By using the silicon wafer as the wafer and each of the compositions for substrate cleaning (D-1) to (D-16) as well as the comparative compositions (c-1) to (c-5), the particle removability and the film removability were evaluated in accordance with the evaluation method mentioned above. These results are shown in Table 3.

TABLE 3

| Run | Composition | Particle removability | Film removability |
|---|---|---|---|
| Evaluation Example 1 | D-1 | A | A |
| Evaluation Example 2 | D-2 | A | A |
| Evaluation Example 3 | D-3 | B | A |
| Evaluation Example 4 | D-4 | A | A |
| Evaluation Example 5 | D-5 | A | B |
| Evaluation Example 6 | D-6 | A | B |
| Evaluation Example 7 | D-7 | A | B |
| Evaluation Example 8 | D-8 | B | B |
| Evaluation Example 9 | D-9 | A | A |
| Evaluation Example 10 | D-10 | A | A |
| Evaluation Example 11 | D-11 | A | A |
| Evaluation Example 12 | D-12 | A | A |
| Evaluation Example 13 | D-13 | A | A |
| Evaluation Example 14 | D-14 | A | A |
| Evaluation Example 15 | D-15 | A | A |
| Evaluation Example 16 | D-16 | A | A |
| Comparative Evaluation Example 1 | c-1 | C | C |
| Comparative Evaluation Example 2 | c-2 | C | A |
| Comparative Evaluation Example 3 | c-3 | C | C |
| Comparative Evaluation Example 4 | c-4 | Inapplicable | Inapplicable |
| Comparative Evaluation Example 5 | c-5 | C | A |

Evaluation Examples 17 to 24 and Comparative Evaluation Examples 6 and 7

The particle removability and the film removability were evaluated in the same way as before except that the silicon wafer was changed to silicon nitride or to titanium nitride and that the combination thereof with the composition for substrate cleaning was changed to those shown in Table 4. These results are shown in Table 4.

TABLE 4

| | | Wafer material | | | |
|---|---|---|---|---|---|
| | | SiN | | TiN | |
| Run | Composition | Particle removability | Film removability | Particle removability | Film removability |
| Evaluation Example 17 | D-9 | A | A | A | A |
| Evaluation Example 18 | D-10 | A | A | A | A |
| Evaluation Example 19 | D-11 | A | A | A | A |
| Evaluation Example 20 | D-12 | A | A | A | A |
| Evaluation Example 21 | D-13 | A | B | A | B |
| Evaluation Example 22 | D-14 | A | B | A | B |
| Evaluation Example 23 | D-15 | A | B | A | B |
| Evaluation Example 24 | D-16 | A | B | A | B |
| Comparative Evaluation Example 6 | c-3 | C | C | C | C |
| Comparative Evaluation Example 7 | c-4 | Inapplicable | Inapplicable | Inapplicable | Inapplicable |

From the comparison between each of Evaluation Examples and Comparative Evaluation Examples, it can be seen that the composition for substrate cleaning according to the present invention is excellent in both the particle removability and the film removability in the substrate cleaning method wherein the film is formed on the substrate surface and then removed. Further, from the comparison between Evaluation Examples 5 to 8 and Comparative Evaluation Examples 13 to 16, it can be seen that the film removability can be enhanced furthermore by adding the organic acids.

Evaluation Examples 25 to 31 and Comparative Evaluation Example

The procedure of Evaluation Examples 4, 5, and 12 to 16, and Comparative Evaluation Example 3 was repeated except that pure water was used as a stripping treatment solvent in place of the dissolving treatment solution to evaluate the particle removability and the film removability. These results are shown in Table 5.

TABLE 5

| Run | Composition | Particle removability | Film removability |
|---|---|---|---|
| Evaluation Example 25 | D-4 | A | A |
| Evaluation Example 26 | D-5 | A | B |
| Evaluation Example 27 | D-12 | A | A |
| Evaluation Example 28 | D-13 | A | A |
| Evaluation Example 29 | D-14 | A | A |
| Evaluation Example 30 | D-15 | A | A |
| Evaluation Example 31 | D-16 | A | A |
| Comparative Evaluation Example 8 | c-3 | C | C |

Evaluation Examples 32 to 36 and Comparative Evaluation Example

The procedure of Evaluation Examples 20 to 24, and Comparative Evaluation Example 6 was repeated except that pure water was used as a stripping treatment solvent in place of the dissolving treatment solution to evaluate the particle removability and the film removability. These results are shown in Table 6.

TABLE 6

| Run | Composition | Wafer material | | | |
|---|---|---|---|---|---|
| | | SiN | | TiN | |
| | | Particle removability | Film removability | Particle removability | Film removability |
| Evaluation Example 32 | D-12 | A | A | A | A |
| Evaluation Example 33 | D-13 | B | B | A | A |
| Evaluation Example 34 | D-14 | B | B | A | A |
| Evaluation Example 35 | D-15 | B | B | A | A |
| Evaluation Example 36 | D-16 | B | B | A | A |
| Comparative Evaluation Example 9 | c-3 | C | C | C | C |

Further effects and modification examples may be readily thought out by those skilled in the art. Therefore, a wider embodiment of the present invention is not limited to certain detailed and representative exemplary embodiments as shown and described above. Consequently, various modifications may be possible without departing from the idea or scope of the overall concept of the invention that is defined by the attached claims and the equivalents thereof.

(1) A substrate cleaning method comprising:

a film-forming treatment solution supply step of supplying to a substrate, a film-forming treatment solution comprising an organic solvent and a fluorine-containing polymer that is soluble in the organic solvent; and a removing solution supply step of supplying to a treatment film formed by solidification or curing of the film-forming treatment solution on the substrate, a removing solution capable of removing the treatment film.

(2) The substrate cleaning method according to (1), wherein the polymer has a partial structure represented by the following formula (1):

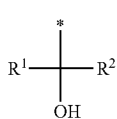

(1)

wherein $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms; and the symbol * shows a bonding site with another atom constituting the polymer.

(3) The substrate cleaning method according to (2), wherein the film-forming treatment solution further contains a low-molecular organic acid.

(4) The substrate cleaning method according to claim 3, wherein the low-molecular organic acid is a polycarboxylic acid.

(5) The substrate cleaning method according to any one of (2) to (4), wherein the film-forming treatment solution contains water at an amount of 20% or less by mass relative to total mass of the organic solvent and the water.

(6) The substrate cleaning method according to any one of (1) to (5), wherein the removing solution supply step comprises:

a stripping treatment solution supply step of supplying to the treatment film, a stripping treatment solution capable of stripping the treatment film from the substrate; and a dissolving treatment solution supply step of, after the stripping treatment solution supply step, supplying to the treatment film, a dissolving treatment solution capable of dissolving the treatment film.

(7) The substrate cleaning method according to (6), wherein the stripping treatment solution is pure water.

(8) A non-transitory computer-readable recording medium storing a program that is executable by a computer and controls a substrate cleaning system, wherein upon execution of the program, the computer controls the substrate cleaning system so that the substrate cleaning method according to any one of (1) to (7) is performed.

EXPLANATION OF REFERENCES

W: Wafer
P: Particle
1: Substrate cleaning system
2: Carry-in/out station
3: Processing station
4: Control device
14: Substrate cleaning device
20: Chamber
21: FFU
30: Substrate holding mechanism
40: Solution supply unit
45*a*: Film-forming treatment solution source
45*b*: DIW source
45*c*: Alkaline aqueous solution source
50: Recovery cup

The invention claimed is:

1. A substrate cleaning method comprising:

supplying to a substrate to which a particle is attached, a film-forming treatment solution comprising an organic solvent and a fluorine-containing polymer that is soluble in the organic solvent;

forming a treatment film comprising the particle incorporated into the treatment film by solidification or curing of the film-forming treatment solution on the substrate;

supplying a treatment solvent or solution to the treatment film on the substrate, wherein the treatment solvent is selected from at least one of pure water and a fluorine-based solvent, and the treatment solution is selected from a group consisting of at least one of pure water mixed with a $CO_2$ gas, water to which a surfactant is added, and isopropyl alcohol diluted with pure water;

separating the particle and the treatment film from the substrate;

supplying, a dissolving treatment solvent or solution to the substrate, the dissolving treatment solvent or solution dissolving the treatment film, and forming on the substrate, a first mixture comprising the treatment solvent or solution, the dissolving solvent or solution, the dissolved treatment film and the particle, wherein the dissolving treatment solvent or solution is selected from:

a group consisting of an alkaline aqueous solution being selected from at least one of water mixed with an ammonia, water mixed with a quaternary ammonium hydroxide, and water mixed with choline;

an alkaline developing solution to which a hydrogen peroxide is added, the alkaline developing solution being selected from at least one of water mixed with ammonia, water mixed with a quaternary ammonium hydroxide, and water mixed with choline;

an acidic developing solvent, the acidic developing solvent being selected from at least one of acetic acid, formic acid, and hydroxyacetic acid; and an organic solvent, the organic solvent being selected from at least one of 4-methyl-2-pentanol, a thinner, toluene, acetate esters, alcohols, and glycols, and wherein the dissolving treatment solvent or solution differs from the treatment solvent or solution; and supplying a rinsing solvent to the first mixture on the substrate to remove the first mixture from the substrate.

2. The substrate cleaning method according to claim 1, wherein the polymer has a partial structure represented by the following formula (1):

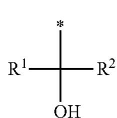

(1)

wherein $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1to 8 carbon atoms; and the symbol * shows a bonding site with another atom constituting the polymer.

3. The substrate cleaning method according to claim 1, wherein the polymer comprises a cyclic polyolefin having a partial structure represented by the following formula (1):

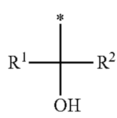

(1)

wherein $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms; and the symbol * shows a bonding site with another atom constituting the polymer.

4. The substrate cleaning method according to claim 1, wherein the polymer comprises a poly(meth)acrylate having a partial structure represented by the following formula (1):

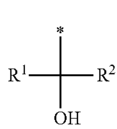

(1)

wherein $R^1$ and $R^2$ each independently represents a hydrogen atom, a fluorine atom, an alkyl group having 1 to 8 carbon atoms, or a fluorinated alkyl group having 1 to 8 carbon atoms, provided that at least one of $R^1$ and $R^2$ is a fluorine atom or a fluorinated alkyl group having 1 to 8 carbon atoms; and the symbol * shows a bonding site with another atom constituting the polymer.

5. The substrate cleaning method according to claim 1, wherein the quaternary ammonium hydroxide solution contains tetramethyl ammonium hydroxide (TMAH).

6. The substrate cleaning method according to claim 1, wherein the dissolving treatment solvent or solution is supplied to the substrate, together with a surfactant.

7. The substrate cleaning method according to claim 2, wherein the film-forming treatment solution further contains a low-molecular-weight organic acid.

8. The substrate cleaning method according to claim 2, wherein the film-forming treatment solution further contains water.

9. The substrate cleaning method according to claim 7, wherein the low-molecular-weight organic acid is a polycarboxylic acid.

10. A non-transitory computer-readable recording medium storing a program that is executable by a computer and controls a substrate cleaning system, wherein upon execution of the program, the computer controls the substrate cleaning system so that a substrate cleaning method is performed, the substrate cleaning method comprising:

supplying to a substrate to which a particle is attached, a film-forming treatment solution comprising an organic solvent and a fluorine-containing polymer that is soluble in the organic solvent;

forming a treatment film comprising the particle incorporated into the treatment film by solidification or curing of the film-forming treatment solution on the substrate;

supplying a treatment solvent or solution to the treatment film on the substrate, wherein the treatment solvent is selected from at least one of pure water and a fluorine-based solvent, and the treatment solution is selected from a group consisting of at least one of pure water mixed with a $CO_2$ gas, water to which a surfactant is added, and isopropyl alcohol diluted with pure water;

separating the particle and the treatment film from the substrate;

supplying a dissolving treatment solvent or solution to the substrate, the dissolving treatment solvent or solution dissolving the treatment film, and forming on the substrate, a first mixture comprising the treatment solvent or solution, the dissolving treatment solvent or solution, the dissolved treatment film and the particle, wherein the dissolving treatment solvent or solution is selected from:

a group consisting of an alkaline aqueous solution being selected from at least one of water mixed with an ammonia, water mixed with a quaternary ammonium hydroxide, and water mixed with choline;

an alkaline developing solution to which a hydrogen peroxide is added, the alkaline developing solution being selected from at least one of water mixed with ammonia, water mixed with a quaternary ammonium hydroxide, and water mixed with choline;

an acidic developing solvent, the acidic developing solvent being selected from at least one of acetic acid, formic acid, and hydroxyacetic acid; and an organic solvent, the organic solvent being selected from at least one of 4-methyl-2-pentanol, a thinner, toluene, acetate esters, alcohols, and glycols, and wherein the dissolving treatment solvent or solution differs from the treatment solvent or solution; and supplying a rinsing solvent to the first mixture on the substrate to remove the first mixture from the substrate.

* * * * *